United States Patent [19]
Widakowich
[11] 3,726,100
[45] Apr. 10, 1973

[54] THERMOELECTRIC APPARATUS COMPOSED OF P-TYPE AND N-TYPE SEMICONDUCTOR ELEMENTS

[75] Inventor: Marius Widakowich, Bromma, Sweden
[73] Assignee: Allmanna Svenska Elektriska Aktiebolaget, Vasteras, Sweden

[22] Filed: Oct. 28, 1968
[21] Appl. No.: 771,195

[52] U.S. Cl. ........................62/3, 136/203, 136/204, 136/205
[51] Int. Cl. ........................F25b 21/02
[58] Field of Search ....................62/3; 136/203, 204, 136/205

[56] References Cited

UNITED STATES PATENTS

| | | | |
|---|---|---|---|
| 2,289,152 | 7/1942 | Telkes | 62/3 |
| 2,978,875 | 4/1961 | Lackey | 62/3 |
| 3,111,813 | 11/1963 | Blumentrett | 62/3 |
| 3,194,023 | 7/1965 | Sudmeier | 62/3 |
| 3,302,414 | 2/1967 | Sudmeier | 62/3 |
| 2,844,638 | 7/1958 | Lindeublad | 62/3 |
| 2,951,105 | 8/1960 | Busanovich | 62/3 |
| 2,964,912 | 12/1960 | Roeder | 62/3 |
| 2,970,450 | 2/1961 | Roeder | 62/3 |
| 2,997,514 | 8/1961 | Roeder | 62/3 |
| 3,052,100 | 9/1962 | Homkes | 62/3 |
| 3,137,141 | 6/1964 | Kistler | 62/3 |
| 3,212,274 | 10/1965 | Sidus | 62/3 |
| 3,256,703 | 6/1966 | Selwitz | 62/3 |
| 3,264,714 | 8/1966 | Baer | 62/3 |

*Primary Examiner*—William J. Wye
*Attorney*—Jennings Bailey, Jr.

[57] ABSTRACT

A thermoelectric apparatus is formed of a plate of heat-insulating material having holes therethrough in which are positioned a plurality of P-type and N-type thermoelectric elements. The members of the two types are alternately connected by heat-transfer members on both sides of the plate and in contact with the elements. Bolts extending through the thermoelectric elements connect two of the heat-transfer members and press them against the elements.

4 Claims, 8 Drawing Figures

INVENTOR.
MARIUS WIDAKOVICH
BY
Jennings Bailey, Jr

INVENTOR.
MARIUS WIDAKOVICH
BY
Jennings Bailey, Jr.

INVENTOR.

BY

THERMOELECTRIC APPARATUS COMPOSED OF P-TYPE AND N-TYPE SEMICONDUCTOR ELEMENTS

BACKGROUND OF THE INVENTION

1. Field of the Invention

The present invention relates to a thermoelectric apparatus, such as a thermoelectric heat pump, a thermoelement or a thermogenerator, comprising a plate of heat-insulating material and a plurality of P-type and N-type semiconductor elements positioned in the plate, their end surfaces being connected in pairs by means of heat-transfer members.

2. The Prior Art

Devices to utilize the Peltier phenomenon with the help of an electric current to effect heat transfer are known. If a direct current is led through a row of alternate P and N conducting semiconductor bodies arranged one after the other, cooling and heating are obtained in alternate contact surfaces between two bodies (soldering point). By arranging a metal body (thermobridge) at each soldering point between two bodies, which electrically and in a heat-conducting manner connects the two semiconductor bodies, the metal body may, for example by being provided with cooling flanges, be used for heat transfer between the soldering points and a surrounding medium, such as air or a liquid. Bismuth telluride has proved to be a suitable semiconductor material. However, this and other suitable materials have the disadvantage that they have poor mechanical strength. It has been proposed to embed a plurality of semiconductor bodies and (partly) the thermo-bridges soldered to those bodies in a plate of, for example synthetic resin, so that the cold thermobridges are on one side of the plate and the hot bridges on the other side. In this way certain protection is obtained against mechanical stresses, but thermal stresses may cause breaks in the solder joints, replacement of a damaged semiconductor body is difficult or impossible and it is difficult to obtain both good strength and good heat insulation. The invention relates to an apparatus with which these disadvantages are eliminated.

SUMMARY OF THE INVENTION

A thermoelectric apparatus according to the invention is characterized in that the semiconductor elements are placed in holes in the plate and that the heat-transfer members at each semiconductor element are pressed against its end surfaces by means of bolts so that the semiconductor elements, together with the heat-transfer members and bolts, form an at least substantially self-supporting unit.

According to one embodiment of the invention the apparatus comprises several groups of semiconductor elements, each group of elements being applied in a separate plate so that if an element is damaged the whole group can easily be replaced by another undamaged group, which considerably simplifies maintainance of the apparatus. The groups preferably consist of the same number of semiconductor elements and are applied in plates of the same size, thus providing a minimum number of types of element groups which must be kept in reserve and also enabling more efficient production.

A particularly simple and advantageous construction is obtained if the plates are made rectangular and suitably arranged beside each other in one and the same plane supported by beams parallel to each other and said plane, preferably T-beams. The apparatus is thus narrow in the direction perpendicular to the plane of the plates and can easily be applied, for example, in the roof or wall of a vehicle. The exchange of an element group is also extremely simple since (at least when heat-transferring air-air) only the two electrical connections of the group need be disconnected, after which the plate can be removed from the framework formed by the beams.

The elements in a group are suitably applied in rows parallel to the edge of the (rectangular) plate and for heat-transfer to air an air current is arranged to flow parallel to the two edges of the plate. As will be shown in the following, it is advantageous that the number of elements in a row parallel to the air current is odd and that the number in a row perpendicular to the air current is even.

The electric voltage across each element is low, some tens of millivolts, and it is advantageous to electrically series-connect a number of element groups so that the voltage of the feeding current source shall not be impractically low. The electrical connections then suitably each consist, at least for heat-transfer to an air current, of a plurality of parallel bendable metal strips substantially parallel with each other arranged so that the air current flows through gaps formed between the strips.

If at least one of the media to which heat-transfer is to take place consists of a liquid, according to the invention at least those heat-transfer members situated on one side of the plate are provided with channels through which a liquid is caused to flow, tubes of electrically insulating material being arranged to connect the channels in the various heat-transfer members together to obtain the required electrical insulation between the heat-transfer members. According to a preferred embodiment of the invention, the liquid connections are made so that the liquid flow passes the transfer members in the same (or opposite) order as they are passed by the electric current. In this way the least possible potential difference is obtained between adjacent transfer members in the direction of the liquid flow and the risk of over-conducting through the liquid and resultant corrosion is reduced. The heat-transfer members in one group can be connected in this way or the groups of elements or both the groups and the members in the groups.

The semiconductor elements may each comprise, in known manner, one semiconductor body or several parallel-connected semiconductor bodies, possibly arranged annularly. The body or bodies can be soldered or held tightly between metallic connection members, for example copper rings. By "semiconductor element" is thus meant in this connection one or more parallel-connected semiconductor bodies, possibly applied between connecting members, which, at least when the thermoelectric apparatus is assembled, form a mechanical unit. According to one embodiment of the invention the elements are constructed so that their contact surfaces engaging the heat-transfer members are spherical. A certain mechanical freedom of movement is thus obtained and the risk of damage because of unevenly distributed loading of the elements is reduced.

The connecting members on both sides of the semiconductor body or bodies may be shaped as truncated conical metal pellets having increasing diameter from the semiconductor bodies towards the cooling body and suitably a flat contact surface engaging the cooling body which gives a large contact surface between the connecting member and the cooling body. According to another embodiment the connecting members on both or only one side of the element may be shaped as truncated cones, becoming narrower in a direction towards the cooling bodies, which are then suitably provided with correspondingly conical recesses. This embodiment provides great contact pressure and also low transmission resistance between connecting member and cooling body.

The heat-insulating plates may, according to a preferred embodiment, comprise two layers of a strong material, such as glass-fiber reinforced plastic, and between these layers a layer of a material having good heat-insulating capacity, such as cellular plastic. A strong, light and rigid plate is thus obtained having good heat-insulation (so-called sandwich construction).

For heat-exchange with air the heat-transfer members are provided in known manner with cooling flanges substantially parallel to the direction of the air current. It has been found that a greater number of short cooling flanges in the direction of the air current provides more effective heat-exchange than fewer, longer flanges having the same total area. According to a preferred embodiment, therefore, the heat-transfer members are arranged substantially and as far as possible with their longitudinal axes perpendicular to the direction of the air current. In order to further increase the effectivity of the heat-exchange two successive heat-transfer members in the direction of the air current may be displaced in relation to each other perpendicular to the direction of the air current by such a distance that the cooling flanges of one member are situated opposite to the spaces between the cooling flanges of the other member. The heat-transfer members within a group may be displaced in relation to each other in this way and/or in relation to another group. The cooling flanges may also be arranged to form a certain angle to the direction of the air current, in which case successive cooling flanges in the direction of the air current are suitably arranged to deviate in opposite directions from the direction of the air current.

BRIEF DESCRIPTION OF THE DRAWINGS

The invention will be described in the following with reference to the accompanying drawings.

DESCRIPTION OF THE PREFERRED EMBODIMENTS

Figure 1:
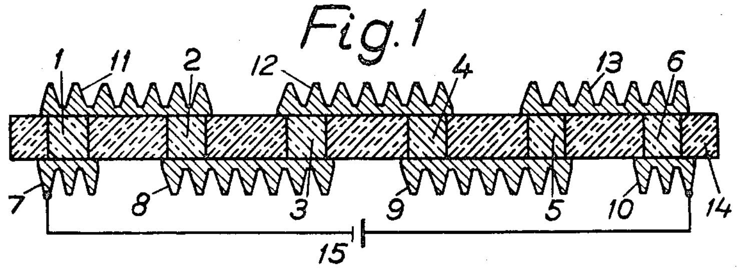
FIG. 1 shows a section through a known thermoelectric heat pump.

In the arrangement shown in FIG. 1 the semiconductor elements 1 – 6 are alternately P and N conducting. They are electrically connected by means of the heat-transfer members 7 – 13 provided with cooling flanges. If a direct current is led through the elements a temperature difference arises between the hot "soldering points", members 11 – 13 and the cold "soldering points," members 7 – 10. The hot and cold sides of the apparatus are separated by the heat-insulating wall 14. The direct current source 15 is connected to the heat-transfer members 7 and 10.

Figure 2:
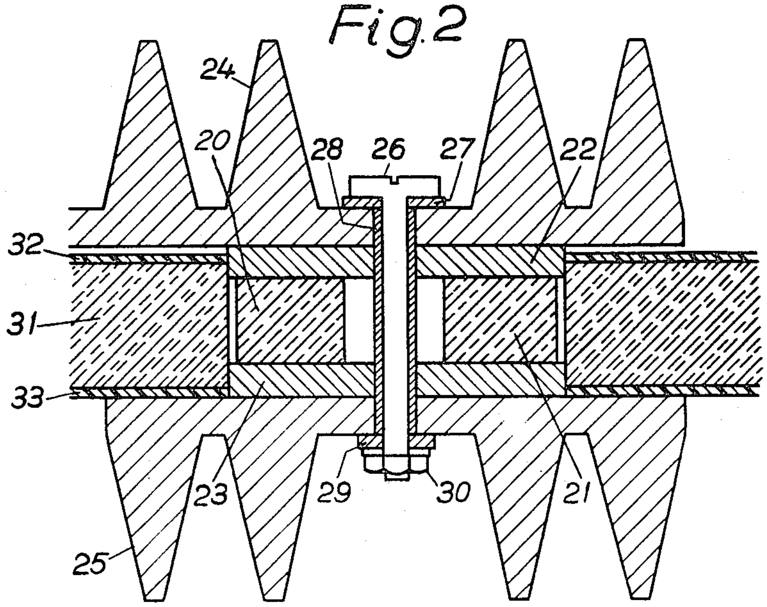
FIG. 2 shows a section through a semiconductor element, the bolt member and two heat-transfer members.

FIG. 2 shows a cross section through a semiconductor element in an apparatus according to the invention. The element comprises a plurality, for example three, parallelepipedic semiconductor bodies of, for example bismuth telluride, P or N conducting, of which bodies 20 and 21 are shown. The element also consists of the copper discs 22 and 23 between which the semiconductor bodies are soldered or merely tightly clamped. The semiconductor element is tightly held between the heat-transfer members 24 and 25, made of aluminum and provided with flanges, with the help of the bolt 26 and nut 30. Suitably a resilient washer, strong helical spring, a number of plate springs or corresponding members may be arranged to give a constant pressure independent of thermal expansion. The insulating washers 27 and 29 and the tube 28 insulate the bolt electrically from the two heat-transfer members. A plate consisting of an intermediate layer 31 of cellular plastic and two adhered outer layers 32 and 33 of glass-fiber reinforced plastic provides good heat insulation between the hot and cold sides of the apparatus and lateral stability.

The semiconductor element may also consist of a single semiconductor body. This may, for example, be annular, and the and element and cooling bodies may be held together by a bolt of screw running through the center of the element. The body may even be parallelepipedic in which case two bolts may be arranged on opposite sides of the body. The bolts are then suitably arranged so that their connecting line is parallel to the cooling flanges so that the bolts (screws) can be placed in the same space between two cooling flanges.

As can be seen from the drawings the heat-insulating plate 31–33 is somewhat thinner than the semiconductor element. This is so that the pressure from the bolt 26 is entirely taken up by the element. It may be advantageous in according with another embodiment of the invention to arrange a relatively large space, for example 2–5 mm, on each side of the plate, between it and the cooling bodies, which permits visual inspection of the end parts of the semiconductor elements along the plane of the plate. With air-cooling the surfaces of the cooling bodies facing the plate also serve as heat-transfer surfaces for the air current. The mentioned surfaces may then be provided with narrow cooling flanges substantially parallel to the air current, which may also have the function of keeping the plate centered between the cooling bodies. The latter function may alternatively be effected by means of elastomeric strips, for example of rubber, placed between the plate and the cooling bodies and substantially parallel to the air current.

Figure 3:
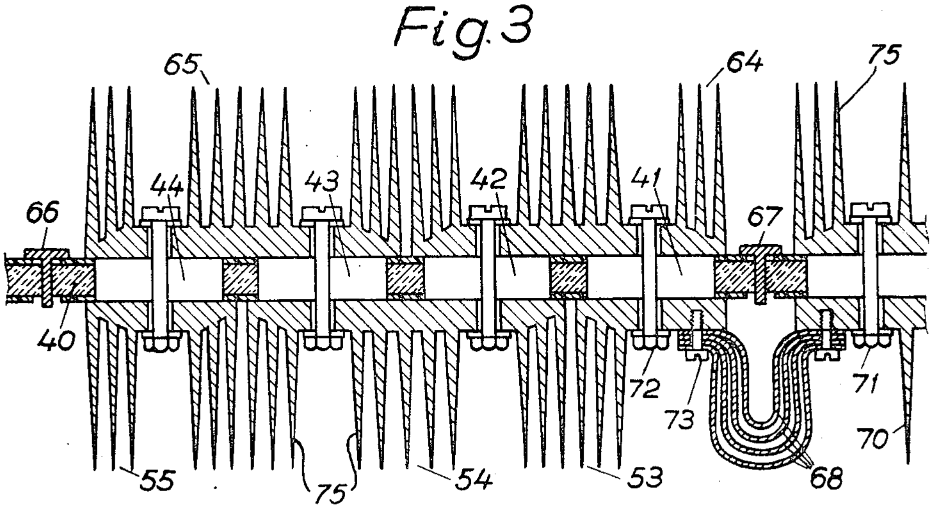
FIG. 3 shows a section through a group of elements, perpendicular to the plane of the plate.
Figure 4:
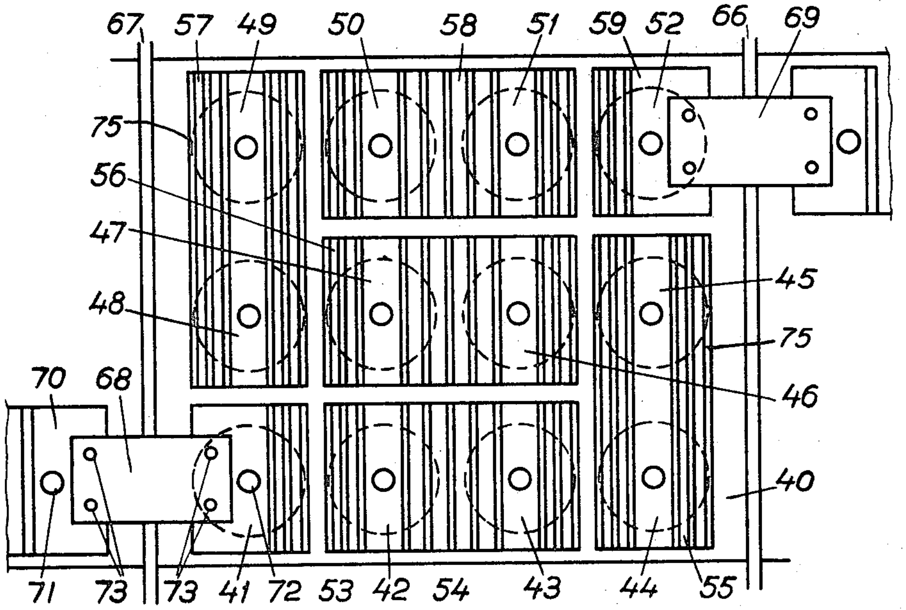
FIGS. 4 and 5 show the same group of elements seen from the cold and hot sides of the plate, respectively.
Figure 5:
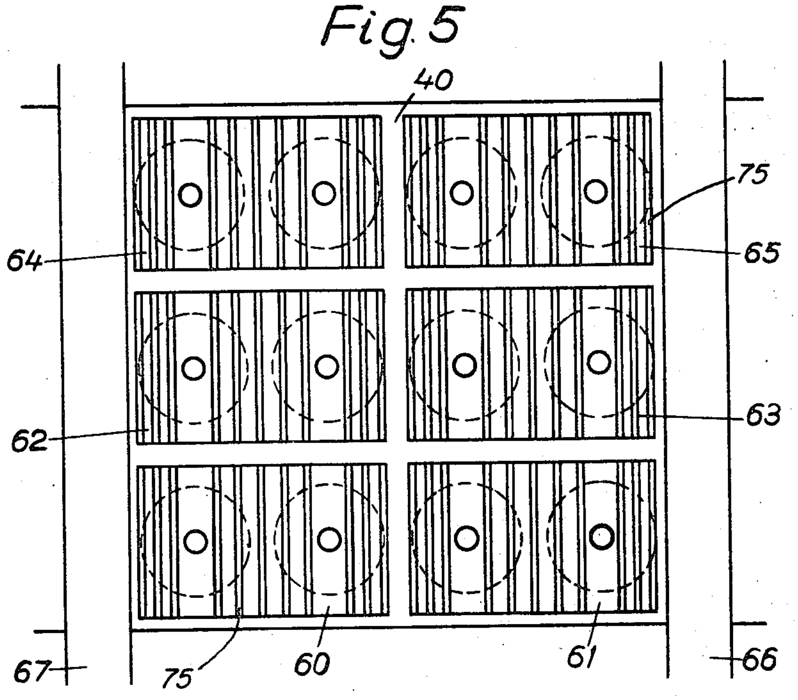

FIGS. 3–5 show a group of elements according to the invention. The twelve semiconductor elements 41–52 are applied in holes in the rectangular plate 40 and held tightly between the heat-transfer members by means of bolts. The heat-transfer members or thermo-bridges designated 53–59 are situated on the lower side of the plate, its cold side, and those designated 60–65 are situated on the upper side of the plate, its hot side. The beams 66 and 67 support this group of elements and also a number of other groups, not shown. The group shown is connected to adjacent groups by means of connecting members 68 and 69. These consist of a number of bendable copper strips the ends of which are provided with holes and pressed against the heat-transfer members to be joined (53 and 70) by means of the screws 73. The strips increase successively in length and are so designed that air gaps are formed between them. The air current flowing parallel to the cooling flanges 75 flows through these gaps and thus contributes satisfactorily to the heat-exchange between the cold side of the semiconductor element 41 and air.

The path of the electric current through the series-connected semiconductor elements is 68–53–41–64–42–54–43–65, and so on. The bridges 60–65 will be heated and the bridges 53–59 cooled. The heat is thus taken from an air current flowing through channels, not shown, along the cold side of the element group and is delivered to the hot side to an air current flowing there. This air current must also remove the electrical dissipation factor developed in the apparatus and the arrangement shown is advantageous. Two short cooling flanges are thus more effective than a single flange twice as long and in the embodiment shown all the bridges on the hot side (60–65) have short flanges, which is not the case with the bridges 55 and 57 on the cold side. This advantageous configuration is obtained since the number of semiconductor elements in the direction of the air current is odd (3) and the number prependicular to said direction even (4). A proportionally greater number of bridges having short flanges is obtained on the cold side if the number of elements in the group is increased, for example to 5 × 6 elements.

As seen from the drawings, the group of elements can easily be taken out for replacement or inspection by disconnecting the two electrical connections 68 and 69. It is also seen that the semiconductor elements, together with the bolt members and thermobridges, form an at least substantially self-supporting unit. The plate 40 may therefore be shaped mainly with regard to its heat-insulating function. All bridging is done on the cold side of the group so that the hot side need not be accessible.

Figure 6:
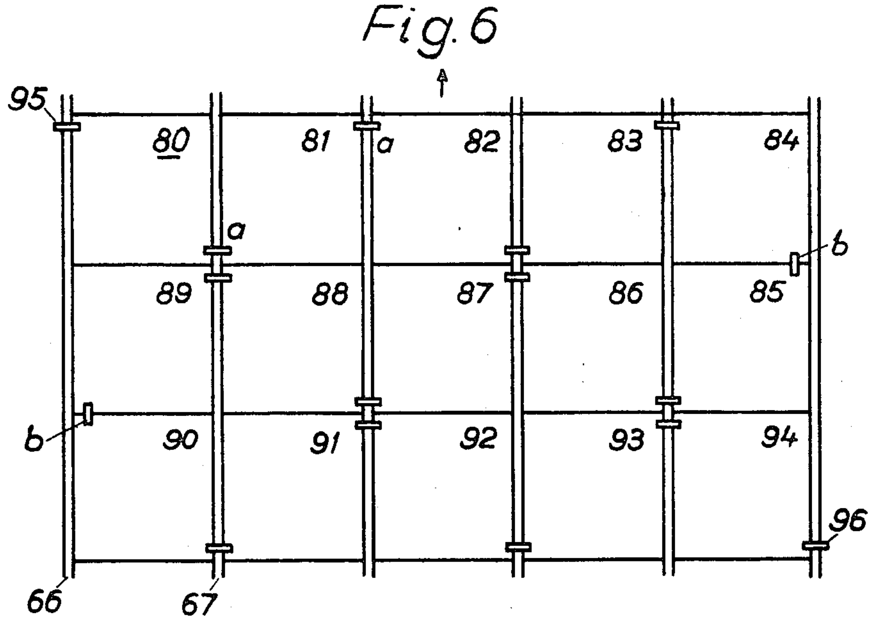
FIG. 6 shows the arrangement and connection of several groups of elements to form a larger unit.

FIG. 6 shows the principle of connecting the groups of elements to form a larger unit, seen from the cold side. The groups 80–94 are placed beside each other and electrically series-connected by the schematically shown connections. The groups 80, 82, 84 and so on, are mutually identical, as are the groups 81, 83, 85, and so on. The groups 85–89 are only turned 180° about an axis perpendicular to the plane of the paper, in relation to the groups 80–84 and 90–94. At the points 95 and 96 the shown unit can be connected to a current source or to another group of elements. The arrow indicated in FIG. 6 shows the direction of the air current.

Since the voltage across each element is low, in a typical case about 50 mV, a number of groups of elements is suitably series-connected in order to enable connection to a suitable feeding source. For apparatus comprising a great number of groups of elements it may also be advantageous to series-parallel connect the groups of elements.

Figure 7A:
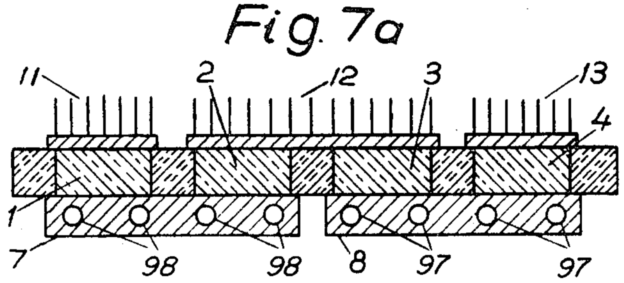
FIG. 7 shows an embodiment of the heat-transfer member for heat-exchange with a liquid.
Figure 7B:
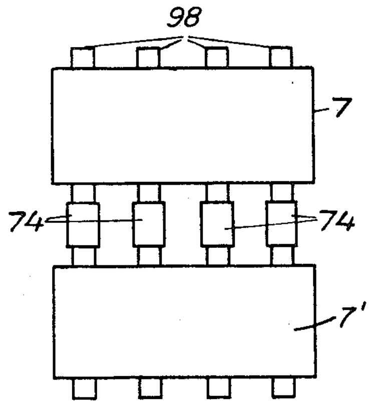

FIGS. 7*a* and *b* show an embodiment of the invention where the heat-transfer members 7, 8 on one side of the plate are provided with cavities such as channels 98 and 97 through which a liquid is brought to flow. The channels may consist, for example, of metal tubes embedded in the heat-transfer members, the channels of the adjacent heat-transfer members (7, 7') ) being connected by means of tubes 74 of insulating material threaded onto the projecting tube stumps. There is always a certain conducting capacity in the liquid flow and, with a view of decreasing the risk of corrosion, the liquid connections between the heat-transfer members within an element group can be made so that the liquid passes the members in the same or opposite order as the electric current. Alternatively or simultaneously, the groups of elements may be connected correspondingly.

The embodiments described above are only examples and a great number of other embodiments of an apparatus according to the invention are feasible.

I claim:

1. Thermoelectric apparatus having a plate of heat-insulating material and a plurality of P-type and N-type semiconductor thermoelectric elements, said plate having a plurality of holes in which said elements are disposed, said elements having a dimension perpendicular to said plate at least equal to the thickness of said plate, a plurality of electrically conducting heat-transfer members on each side of said plate for transfer of heat between the elements and a fluid medium and in good electric and thermal pressure contact with said elements, said members connecting said P-type and N-type elements alternately in electrical series relationship, a current source connected to two of said members, and clamping means adjacent each of said elements engaging and pressing two of said members against the ends of each element, whereby said members, together with said elements, form an essentially self-supporting structure.

2. Thermoelectric apparatus according to claim 1, having a plurality of equally large groups of thermoelectric elements, each group being disposed in a separate heat-insulating plate, said plates being equal and rectangular and disposed in the same plane, and beams parallel to each other and to said plane, said plates being mounted on said beams.

3. Thermoelectric apparatus according to claim 2, said groups of elements being connected in series relationship.

4. Thermoelectric apparatus according to claim 1, the heat-transfer members on at least one side of said plate having cavities, electrically insulating tubes connecting said heat-transfer members, so as to permit a flow of liquid through said cavities and tubes, said flow of cooling liquid passing said heat-transfer members in the same order as the electric current.

* * * * *